US010100218B2

(12) United States Patent
Takahashi et al.

(10) Patent No.: US 10,100,218 B2
(45) Date of Patent: Oct. 16, 2018

(54) CURABLE COMPOSITION FOR INKJET, AND METHOD FOR PRODUCING ELECTRONIC PART

(71) Applicant: SEKISUI CHEMICAL CO., LTD., Osaka, Osaka (JP)

(72) Inventors: Ryosuke Takahashi, Osaka (JP); Takanori Inoue, Osaka (JP); Michihisa Ueda, Osaka (JP); Takashi Watanabe, Osaka (JP); Shigeru Nakamura, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 316 days.

(21) Appl. No.: 14/427,621

(22) PCT Filed: Sep. 19, 2013

(86) PCT No.: PCT/JP2013/075276
§ 371 (c)(1),
(2) Date: Mar. 11, 2015

(87) PCT Pub. No.: WO2014/050688
PCT Pub. Date: Apr. 3, 2014

(65) Prior Publication Data

US 2015/0247055 A1 Sep. 3, 2015

(30) Foreign Application Priority Data

Sep. 27, 2012 (JP) ................................ 2012-214992

(51) Int. Cl.

| | |
|---|---|
| ***C08F 2/46*** | (2006.01) |
| ***C09D 133/14*** | (2006.01) |
| ***C09D 11/101*** | (2014.01) |
| ***C09D 11/328*** | (2014.01) |
| ***C09D 163/00*** | (2006.01) |
| ***H05K 3/28*** | (2006.01) |

(52) U.S. Cl.
CPC .......... *C09D 133/14* (2013.01); *C09D 11/101* (2013.01); *C09D 11/328* (2013.01); *C09D 163/00* (2013.01); *H05K 3/287* (2013.01); *H05K 2203/013* (2013.01)

(58) Field of Classification Search
CPC .. C09D 11/101; C09D 11/328; C09D 163/00; C09D 133/14; H05K 3/287; H05K 2203/013
See application file for complete search history.

(56) References Cited

U.S. PATENT DOCUMENTS

| | | | |
|---|---|---|---|
| 2002/0137818 A1 | 9/2002 | Yu et al. | |
| 2006/0058412 A1 | 3/2006 | Kakinuma et al. | |
| 2008/0250973 A1* | 10/2008 | Leenders ................ | B41M 3/14 106/31.92 |
| 2013/0216726 A1 | 8/2013 | Ueda et al. | |

FOREIGN PATENT DOCUMENTS

| | | |
|---|---|---|
| EP | 1 624 001 A1 | 2/2006 |
| EP | 2 620 478 A1 | 7/2013 |
| EP | 2 620 479 A1 | 7/2013 |
| JP | 2007-11321 A | 1/2007 |
| JP | 2010-59299 A | 3/2010 |
| JP | 2012-52046 A | 3/2012 |
| JP | 2012-87098 A | 5/2012 |
| JP | 2012-136681 A | 7/2012 |
| JP | 2012-162646 A | 8/2012 |
| JP | 2012-167268 A | 9/2012 |
| WO | WO-2004/099272 A1 | 11/2004 |
| WO | WO-2012/039372 A1 | 3/2012 |
| WO | WO-2012/039379 A1 | 3/2012 |
| WO | WO-2012/132423 A1 | 10/2012 |

OTHER PUBLICATIONS

The First Office Action for the Application No. 201380050671.2 from The State Intellectual Property Office of the People's Republic of China dated Oct. 10, 2015.
Supplementary European Search Report for the Application No. EP 13 64 0927 dated Apr. 5, 2016.
Written Opinion of the International Searching Authority (PCT/ISA/237) for Application No. PCT/JP20131075276 dated Dec. 24, 2013 (English Translation dated Apr. 9, 2015).
International Search Report for the Application No. PCT/JP2013/075276 dated Dec. 24, 2013.
Written Opinion of the International Searching Authority (PCT/ISA/237) for Applicaton No. PCT/JP2013/075276 dated Dec. 24, 2013.
European Office Action for the Application No. 13 840 927.1 dated Mar. 7, 2017.
European Office Action for the Application No. 13 840 927.1 dated Nov. 3, 2017.

* cited by examiner

*Primary Examiner* — Robert S Walters, Jr.
(74) *Attorney, Agent, or Firm* — Cheng Law Group, PLLC

(57) ABSTRACT

Provided is a curable composition for inkjet, which can have improved storage stability. The curable composition for inkjet according to the present invention can be applied in an inkjet mode, and can be cured by the irradiation with light and the application of heat, the curable composition for inkjet according to the present invention comprises a polyfunctional compound having at least two (meth)acryloyl groups, a compound having a cyclic ether group, a heat-curing agent and a color material which cannot be dissolved in the polyfunctional compound and which is dissolved in the curable composition.

19 Claims, No Drawings

CURABLE COMPOSITION FOR INKJET, AND METHOD FOR PRODUCING ELECTRONIC PART

TECHNICAL FIELD

The present invention relates to curable composition for inkjet which can be applied in an inkjet mode, specifically a curable composition for inkjet which can be used suitably for forming a cured product layer such as a resist pattern on a substrate. The present invention also relates to a method for producing an electronic part which is equipped with a cured product layer formed from the curable composition for inkjet.

BACKGROUND ART

Many printed wiring boards in each of which a solder resist pattern that is a pattern-like solder resist film is formed on a substrate having a wiring line formed on the upper surface thereof have been used. The formation of fine solder resist patterns have been demanded in printed wiring boards with the decrease in size and the increase in density of electronic devices in which the printed wiring boards are installed.

As a method for forming a fine solder resist pattern, a method of applying a solder resist composition in an inkjet mode has been proposed. In an inkjet mode, the number of steps is reduced compared with a case in which a solder resist pattern is formed in a screen printing mode. Therefore, a solder resist pattern can be formed easily and efficiently in an inkjet mode.

When a solder resist composition is applied in an inkjet mode, it is required that the viscosity of the solder resist composition is low to some extent during the application of the composition. In recent years, on the other hand, an inkjet device that can print with a solder resist composition while warming the solder resist composition to 50° C. or higher. When the solder resist composition is warmed to 50° C. or higher in the inkjet device, the viscosity of the solder resist composition can become relatively low and, therefore, the ejection properties of the solder resist composition using the inkjet device would be further improved.

A solder resist composition that can be applied in an inkjet mode is disclosed in Patent Document 1 shown below. Patent Document 1 discloses a curable composition for inkjet which comprises a monomer having a (meth)acryloyl group and a heat-curable functional group, a photo-reactive diluent having a weight average molecular weight of 700 or less and a photopolymerization initiator. The viscosity of the curable composition for inkjet is 150 mPa·s or less at 25° C.

RELATED ART DOCUMENT

Patent Document

Patent Document 1: WO2004/099272A1

SUMMARY OF THE INVENTION

Problems to be Solved by the Invention

The curable composition for inkjet described in Patent Document 1 has a relatively low viscosity. Therefore, the curable composition for inkjet described in Patent Document 1 can be applied onto a substrate in an inkjet mode.

In the curable composition for inkjet described in Patent Document 1, however, gelation often proceeds during storage. That is, the storage stability of the curable composition for inkjet is often low.

In addition, the curable composition for inkjet described in Patent Document 1 has such a problem that the pot life of the curable composition under a condition having a temperature of 50° C. or higher is short, because the curable composition contains a monomer having a (meth)acryloyl group and a heat-curable functional group.

For example, when a curable composition for inkjet is ejected using an inkjet device, the curable composition for inkjet generally stays in the inkjet device for a certain period of time after being supplied into the inkjet device. On the other hand, for the purpose of improving the ejection properties of the curable composition, the inside of the inkjet device is sometimes warmed to 50° C. or higher. In the inkjet device that is warmed to 50° C. or higher, the curing of the curable composition for inkjet described in Patent Document 1 often proceeds, which leads to the increase in the viscosity of the composition and the difficulty of the ejection of the composition.

An object of the present invention is to provide: a curable composition for inkjet which can have improved storage stability; and a method for producing an electronic part using the curable composition for inkjet.

A limited object of the present invention is to provide: a curable composition for inkjet which has a long pot life under a condition, i.e., the inside of an inkjet device, which is warmed to 50° C. or higher in spite of a fact that the curable composition contains a compound having a cyclic ether group; and a method for producing an electronic part using the curable composition for inkjet.

Means for Solving the Problems

According to a broad aspect of the present invention, a curable composition for inkjet is provided, which can be applied in an inkjet mode, can be cured by the irradiation with light and the application of heat, and comprises a polyfunctional compound having at least two (meth)acryloyl groups, a compound having a cyclic ether group, a heat-curing agent and a color material which cannot be dissolved in the polyfunctional compound and which is dissolved in the curable composition.

In a specific aspect of the curable composition for inkjet according to the present invention, the heat-curing agent is a viscous reaction product produced by reacting dicyandiamide or a hydrazide compound with a functional-group-containing compound having a functional group capable of reacting with dicyandiamide or the hydrazide compound.

In a specific aspect of the curable composition for inkjet according to the present invention, the viscosity of the curable composition which is not heated yet is 160 mPa·s or more and 1200 mPa·s or less at 25° C., and the ratio of the viscosity of the curable composition which is heated at 80° C. for 24 hours under an oxygen-free condition to the viscosity of the curable composition which is not heated yet is 1.1 or less, wherein the viscosities are measured in accordance with JIS K2283.

In a specific aspect of the curable composition for inkjet according to the present invention, the color material can be dissolved in the compound having a cyclic ether group.

In a broad aspect of the present invention, a method for manufacturing an electronic part is provided, which comprises the steps of: applying a curable composition for inkjet as mentioned above in an inkjet mode to draw a pattern; and irradiating the pattern of the curable composition for inkjet with light and then applying heat to the pattern to cure the pattern, thereby forming a cured product layer.

Effect of the Invention

The curable composition for inkjet according to the present invention comprises a polyfunctional compound having at least two (meth)acryloyl groups, a compound having a cyclic ether group, a heat-curing agent and a color material, the color material cannot be dissolved in the polyfunctional compound and the color material is dissolved in the curable composition. Therefore, the storage stability of the curable composition can be improved.

EMBODIMENTS OF THE INVENTION

Hereinbelow, the present invention will be described in detail.

(Curable Composition for Inkjet)

The curable composition for inkjet according to the present invention can be applied in an inkjet mode for use. The curable composition for inkjet according to the present invention comprises a polyfunctional compound having at least two (meth)acryloyl groups (A), a photopolymerization initiator (B), a compound having a cyclic ether group (C), a heat-curing agent (D) and a color material (E). The color material (E) cannot be dissolved in the polyfunctional compound (A), and the color material is dissolved in the curable composition. The term "(meth)acryloyl group" refers to an acryloyl group and a methacryloyl group.

Since the curable composition for inkjet has the above-mentioned composition and the above-mentioned color material (E) is used in the curable composition, the storage stability of the curable composition can be improved and the pot life of the curable composition for inkjet can be prolonged satisfactorily even under a condition, i.e., the inside of an inkjet device which is warmed to 50° C. or higher. Further, even when the curable composition for inkjet which is not applied in an inkjet mode yet is warmed to 50° C. or higher, the viscosity of the curable composition is rarely increased and the heat-curing of the curable composition hardly proceeds. Therefore, the curable composition for inkjet has excellent storage stability under high temperature conditions and can be ejected through an inkjet nozzle stably. The present inventors have found that, when a curable composition for inkjet comprises a polyfunctional compound (A), a photopolymerization initiator (B), a compound having a cyclic ether group (C) and a heat-curing agent (D) and additionally comprises a color material (E) which cannot be dissolved in the polyfunctional compound (A) and is dissolved in the curable composition, the storage stability of the curable composition for inkjet is increased.

The curable composition for inkjet according to the present invention can be cured by the irradiation with light, because the curable composition contains the polyfunctional compound (A) and the photopolymerization initiator (B). The curable composition for inkjet according to the present invention can also be cured by the application of heat, because the curable composition contains the compound having a cyclic ether group (C) and the heat-curing agent (D). That is, the curable composition for inkjet according to the present invention can be cured by the irradiation with light and the application of heat, and is therefore a light-curable and heat-curable composition for inkjet.

The curable composition for inkjet according to the present invention can be irradiated with light to produce a primary cured product, and then heat is applied to the primary cured product to cause the main curing of the curable composition. In this manner, a cured product, i.e., a cured product layer such as a resist pattern can be produced. Thus, the wet-spreading of the curable composition for inkjet applied on an application object member, such as a substrate, can be prevented by carrying the primary curing of the curable composition for inkjet by the irradiation with light. Consequently, it becomes possible to form a cured product layer such as a fine resist pattern with high accuracy.

Furthermore, since the curable composition for inkjet according to the present invention contains particularly the compound having a cyclic ether group (C), the heat resistance of a cured product that is produced by curing the curable composition can be increased.

It is preferred that the heat-curing agent (D) is a viscous material rather than a solid material such as particles. For example, the heat-curing agent (D) is preferably a viscous reaction product produced by reacting dicyandiamide or a hydrazide compound with a functional-group-containing compound having a functional group capable of reacting with dicyandiamide or the hydrazide compound. When the viscous reaction product is used, the inkjet ejection properties can be further improved.

Hereinbelow, the components contained in the curable composition for inkjet according to the present invention will be described in detail.

[Polyfunctional Compound (A)]

For the purpose of curing the curable composition for inkjet by the irradiation with light, the curable composition contains a polyfunctional compound having at least two (meth)acryloyl groups (A). The polyfunctional compound (A) is not particularly limited, as long as at least two (meth)acryloyl groups are contained. As the polyfunctional compound (A), a conventional known polyfunctional compound having at least two (meth)acryloyl groups can be used. Since the polyfunctional compound (A) has at least two (meth)acryloyl groups, the polymerization proceeds upon the irradiation with light and consequently the curable composition is cured. Thus, the curing of the curable composition can be allowed to proceed by the irradiation with light, the shape of an applied part can be retained, and the excess wet-spreading of a primary cured product and a cured product of the curable composition which is produced by the irradiation with light can be prevented effectively. As the polyfunctional compound (A), only one type may be used, or a combination of at least two types may also be used.

Examples of the polyfunctional compound (A) include a (meth)acrylic acid adduct of a polyhydric alcohol, a (meth)acrylic acid adduct of a modified product of a polyhydric alcohol with an alkylene oxide, a urethane (meth)acrylate compound and a polyester (meth)acrylate compound. Examples of the polyhydric alcohol include diethylene glycol, triethylene glycol, polyethylene glycol, dipropylene glycol, tripropylene glycol, polypropylene glycol, trimethylolpropane, cyclohexanedimethanol, tricyclodecanedimethanol, an alkylene oxide adduct of bisphenol A, and pentaerythritol. The term "(meth)acrylate" refers to an acrylate and a methacrylate. The term "(meth)acrylic" refers to an acrylic and a methacrylic.

The polyfunctional compound (A) is preferably a polyfunctional compound having a polycyclic skeleton and also having at least two (meth)acryloyl groups (A1). When the polyfunctional compound (A1) is used, the wet heat resistance of a cured product of the curable composition for inkjet can be increased. Thus, a printed wiring board produced using the curable composition for inkjet can be used for a prolonged period of time, and the reliability of the printed wiring board can be improved.

The polyfunctional compound (A1) is not particularly limited, as long as polyfunctional compound (A1) has the polycyclic skeleton and also has at least two (meth)acryloyl groups. As the polyfunctional compound (A1), a conventional known polyfunctional compound having a polycyclic skeleton and also having at least two (meth)acryloyl groups can be used. The polymerization of the polyfunctional compound (A1) can proceed to cure the polyfunctional compound (A1) upon the irradiation with light, since the polyfunctional compound (A1) has at least two (meth) acryloyl groups. As the polyfunctional compound (A1), only one type may be used, or a combination of at least two types may also be used.

Examples of the polyfunctional compound (A1) include a (meth)acrylic acid adduct of a polyhydric alcohol, a (meth) acrylic acid adduct of a modified product of a polyhydric alcohol with an alkylene oxide, a urethane (meth)acrylate compound and a polyester (meth)acrylate compound. Examples of the polyhydric alcohol include diethylene glycol, triethylene glycol, polyethylene glycol, dipropylene glycol, tripropylene glycol, polypropylene glycol, trimethylolpropane and pentaerythritol.

Specific examples of the polyfunctional compound (A1) include tricyclodecanedimethanol di(meth)acrylate, isobornyldimethanol di(meth)acrylate and dicyclopentenyldimethanol di(meth)acrylate. From the viewpoint of the further improvement in wet heat resistance of the cured product, the polyfunctional compound (A1) is preferably tricyclodecanedimethanol di(meth)acrylate, isobornyldimethanol di(meth)acrylate or dicyclopentenyldimethanol di(meth) acrylate, more preferably tricyclodecanedimethanol di(meth)acrylate. The term "(meth)acrylate" refers to an acrylate and a methacrylate, The term "polycyclic skeleton" as used in the polyfunctional compound (A1) and a monofunctional compound (G) as mentioned below refers to a structure having contiguous multiple cyclic skeletons. Examples of the polycyclic skeleton in the polyfunctional compound (A1) and the monofunctional compound (G) include a polycyclic alicyclic skeleton and a polycyclic aromatic skeleton. Among these skeletons, a polycyclic alicyclic skeleton is preferred.

Examples of the polycyclic alicyclic skeleton include a bicycloalkane skeleton, a tricycloalkane skeleton, a tetracycloalkane skeleton and an isobornyl skeleton.

Examples of the polycyclic aromatic skeleton include a naphthalene ring skeleton, an anthracene ring skeleton, a phenanthrene ring skeleton, a tetracene ring skeleton, a chrysene ring skeleton, a triphenylene ring skeleton, a tetraphene ring skeleton, a pyrene ring skeleton, a pentacene ring skeleton, a picene ring skeleton and a perylene ring skeleton.

The amount of the polyfunctional compound (A) to be added is properly controlled so as to cause proper curing upon the irradiation with light, and is not particularly limited. The amount of the polyfunctional compound (A) to be contained is preferably 20% by weight or more, more preferably 40% by weight or more, still more preferably 60% by weight or more, and preferably 95% by weight or less, more preferably 90% by weight or less, in 100% by weight of the curable composition for inkjet. The upper limit of the amount of the polyfunctional compound (A) to be added in 100% by weight of the curable composition for inkjet is properly controlled depending on the amounts of the components (B) to (E) and other components and the like.

When the polyfunctional compound (A1) and the below-mentioned monofunctional compound (G) are used in combination, it is preferred that the content of the polyfunctional compound (A1) is 20% by weight or more and 70% by weight or less relative to the total content, i.e., 100% by weight, of the polyfunctional compound (A1), the monofunctional compound (G) and the photopolymerization initiator (B). In 100% by weight of the curable composition for inkjet, the content of the polyfunctional compound (A1) is more preferably 40% by weight or more, and more preferably 60% by weight or less. When the content of the polyfunctional compound (A1) is equal to or more than the lower limit, the curable composition can be cured more effectively by the irradiation with light. When the content of the polyfunctional compound (A1) is equal to or lower than the upper limit, the wet heat resistance of the cured product can be further improved.

[Photopolymerization Initiator (B)]

For the purpose of curing the curable composition for inkjet by the irradiation with light, it is preferred that the curable composition for inkjet also contains a photopolymerization initiator (B) in addition to the polyfunctional compound (A). The photopolymerization initiator (B) may be a photo-radical polymerization initiator, a photo-cationic polymerization initiator or the like. The photopolymerization initiator (B) is preferably a photo-radical polymerization initiator. As the photopolymerization initiator (B), only one type may be used, or a combination of at least two types may also be used.

The photo-radical polymerization initiator is not particularly limited. The photo-radical polymerization initiator is a compound which can generate radial upon the irradiation with light to initiate a radical polymerization reaction. Specific examples of the photo-radical polymerization initiator include benzoin, a benzoin alkyl ether compound, an acetophenone compound, an aminoacetophenone compound, an anthraquinone compound, a thioxanthone compound, a ketal compound, a 2,4,5-triarylimidazole dimer, riboflavin tetrabutyrate, a thiol compound, 2,4,6-tris-s-triazine, an organohalogen compound, a benzophenone compound, a xanthone compound and 2,4,6-trimethylbenzoyldiphenylphosphine oxide. As the photo-radical polymerization initiator, only one type may be used, or a combination of at least two types may also be used.

Examples of the benzoin alkyl ether compound include benzoin methyl ether, benzoin ethyl ether and benzoin isopropyl ether. Examples of the acetophenone compound include acetophenone, 2,2-dimethoxy-2-phenylacetophenone, 2,2-diethoxy-2-phenylacetophenone and 1,1-dichloroacetophenone. Examples of the aminoacetophenone compound include 2-methyl-1-[4-(methylthio)phenyl]-2-morpholinopropan-1-one, 2-benzyl-2-dimethylamino-1-(4-morpholinophenyl)-butan-1-one and N,N-dimethylaminoacetophenone. Examples of the anthraquinone compound include 2-methylanthraquinone, 2-ethylanthraquinone, 2-t-butylanthraquinone and 1-chloroanthraquinone. Examples of the thioxanthone compound include 2,4-dimethylthioxanthone, 2,4-diethylthioxanthone, 2-chlorothioxanthone and 2,4-diisopropylthioxanthone. Examples of the ketal compound include acetophenone dimethyl ketal and benzyl dimethyl ketal. Examples of the thiol compound include 2-mercaptobenzimidazole, 2-mercaptobenzoxazole and 2-mercaptobenzothiazole. Examples of the organohalogen compound include 2,2,2-tribromoethanol and tribromomethylphenylsulfone. Examples of the benzophenone compound include benzophenone and 4,4'-bisdiethylaminobenzophenone.

The photo-radical polymerization initiator is preferably an α-aminoalkylphenone-type photo-radical polymerization initiator, and more preferably an α-aminoalkylphenone-type photo-radical polymerization initiator having a dimethylamino group. When any one of the specific photo-radical polymerization initiators is used, it becomes possible to photo-cure the curable composition for inkjet with high efficiency even when the amount of exposure light is small. The wet-spreading of the applied curable composition for inkjet can be prevented effectively by the irradiation with light, and consequently a fine resist pattern can be formed with high accuracy. When the photo-radical polymerization initiator is an α-aminoalkylphenone-type photopolymerization initiator having a dimethylamino group, the heat curing rate can be increased and consequently the heat curability of the light irradiation product of the composition can become good.

Specific examples of the α-aminoalkylphenone-type photo-radical polymerization initiator include IRGACURE 907, IRGACURE 369, IRGACURE 379 and IRGACURE 379EG which are products manufactured by BASF. An α-aminoalkylphenone-type photopolymerization initiator other than the above-mentioned products may also be used. Among these compounds, 2-benzyl-2-dimethylamino-1-(4-morpholinophenyl)-butanone-1 (IRGACURE 369) or 2-(dimethylamino)-2-[(4-methylphenyl)methyl]-1-[4-(4-morpholinyl)phenyl]-1-butanone (IRGACURE 379 or IRGACURE 379EG) is preferred from the viewpoint of the further improvement in the photocurability of the curable composition for inkjet and the insulation reliability by the cured product. These products are α-aminoalkylphenone-type photo-radical polymerization initiators each having a dimethylamino group.

A photopolymerization initiation aid may be used together with the photo-radical polymerization initiator. Examples of the photopolymerization initiation aid include N,N-dimethylaminobenzoic acid ethyl ester, N,N-dimethylaminobenzoic acid isoamyl ester, pentyl-4-dimethylaminobenzoate, triethylamine and triethanolamine. A photopolymerization initiation aid other than the above-mentioned compounds may also be used. As the photopolymerization initiation aid, only one type may be used, or a combination of at least two types may also be used.

Alternatively, a titanocene compound such as CGI-784 (Ciba Specialty Chemicals Inc.) which has absorption in a visible region may be used for the purpose of accelerating the photo-reaction.

The photo-cationic polymerization initiator is not particularly limited, and examples include a sulfonium salt, an iodonium salt, a metallocene compound and benzoin tosylate. As the photo-cationic polymerization initiator, only one type may be used, or a combination of at least two types may also be used.

The content of the photopolymerization initiator (B) is preferably 0.1 parts by weight or more, more preferably 1 part by weight or more, still more preferably 3 parts by weight or more, and preferably 30 parts by weight or less, more preferably 15 parts by weight or less, still more preferably 10 parts by weight or less, relative to 100 parts by weight of the polyfunctional compound (A). When the content of the photopolymerization initiator (B) is equal to or more than the lower limit and is equal to or lower than the upper limit, the curable composition can be cured more effectively by the irradiation with light.

[Compound Having Cyclic Ether Group (C)]

For the purpose of enabling the curable composition for inkjet to be cured by the application of heat, the curable composition for inkjet contains a compound having a cyclic ether group (C). When the compound (C) is used, it becomes possible to further cure the curable composition or the primary cured product of the curable composition by the application of heat. Thus, the use of the compound (C) enables the formation of a resist pattern with high efficiency and with high accuracy, and also enables the improvement in heat resistance and insulation reliability of the cured product. As the compound having a cyclic ether group (C), only one type may be used, or a combination of at least two types may also be used.

The compound having a cyclic ether group (C) is not particularly limited, as long as the compound has a cyclic ether group. Examples of the cyclic ether group in the compound (C) include an epoxy group and an oxetanyl group. Among these groups, the cyclic ether group is preferably an epoxy group from the viewpoint of the improvement in curability and the production of a cured product having superior heat resistance and insulation reliability. It is preferred that the compound having a cyclic ether group (C) has at least two cyclic ether groups.

Examples of the compound having an epoxy group include a bisphenol S-type epoxy compound, a diglycidylphthalate compound, a heterocyclic epoxy compound such as triglycidyl isocyanurate, a bixylenol-type epoxy compound, a biphenol-type epoxy compound, a tetraglycidylxylenoylethane compound, a bisphenol A-type epoxy compound, a hydrogenated bisphenol A-type epoxy compound, a bisphenol F-type epoxy compound, a brominated bisphenol A-type epoxy compound, a phenol novolac-type epoxy compound, a cresol novolac-type epoxy compound, an alicyclic epoxy compound, a novolac-type epoxy compound of bisphenol A, a chelate-type epoxy compound, a glyoxal-type epoxy compound, an epoxy compound containing an amino group, a rubber-modified epoxy compound, a dicyclopentadienephenolic-type epoxy compound, a silicone-modified epoxy compound and an ε-caprolactone-modified epoxy compound.

A compound having an oxetanyl group is exemplified in, for example, JP 3074086 B1.

It is preferred that the compound having a cyclic ether group (C) has an aromatic skeleton. When a compound having an aromatic skeleton and a cyclic ether group is used, the thermal stability of the curable composition during storage or upon ejection can be further improved, and consequently the gelation of the curable composition is hardly caused during storage. Furthermore, a compound having an aromatic skeleton and a cyclic ether group has excellent compatibility with the polyfunctional compound (A), the monofunctional compound (G) and the curing agent (C) compared with a compound having no aromatic skeleton and having a cyclic ether group, and therefore insulation reliability can be further improved.

It is preferred that the compound having a cyclic ether group (C) has a liquid form at 25° C. The viscosity of the compound having a cyclic ether group (C) is preferably more than 300 mPa·s at 25° C. The viscosity of the compound having a cyclic ether group (C) is preferably 80 Pa·s or less at 25° C. When the viscosity of the compound having a cyclic ether group (C) is equal to or more than the lower limit, the resolution upon the formation of the cured product layer can be further improved. When the viscosity of the compound having a cyclic ether group (C) is equal to or lower than the upper limit, the ejection properties of the curable composition can become better, and the compatibility of the compound having a cyclic ether group (C) with other components can be further improved and the insulation reliability can also be further improved.

The amount of the compound having a cyclic ether group (C) to be added is properly controlled so that the curable composition can be cured properly by the application of heat, and is not particularly limited. The content of the compound having a cyclic ether group (C) is preferably 3% by weight or more, and preferably 60% by weight or less, more preferably 50% by weight or less, still more preferably 40% by weight or less, in 100% by weight of the curable composition for inkjet. When the content of the compound (C) is equal to or more than the lower limit, it becomes possible to cure the curable composition more effectively by the application of heat. When the content of the compound (C) is equal to or lower than the upper limit, the heat resistance of the cured product can be further improved.

[Heat-Curing Agent (D)]

For the purpose of enabling the curable composition for inkjet to be cured with high efficiency by the application of heat, the curable composition for inkjet contains a heat-curing agent (D). The heat-curing agent (D) can cure the compound having a cyclic ether group (C). The heat-curing agent (D) is not particularly limited. As the heat-curing agent (D), a conventional known heat-curing agent can be used. As the heat-curing agent (D), only one type may be used, or a combination of at least two types may also be used. From the viewpoint of the extension of the pot life of the curable composition for inkjet, the heat-curing agent (D) is preferably a latent heat-curing agent.

Examples of the heat-curing agent (D) include an organic acid, an amine compound, an amide compound, a hydrazide compound, an imidazole compound, an imidazoline compound, a phenol compound, a urea compound, a polysulfide compound and an acid anhydride. As the heat-curing agent (D), a modified polyamine compound such as an amine-epoxy adduct may be used. A heat-curing agent (D) other than the above-mentioned compounds may also be used.

Specific examples of the heat-curing agent (D) include dicyandiamide, a hydrazide compound, an imidazole compound, a compound having a triazine ring, a latent heat-curing agent which is produced by coating triphenylphosphine (a heat-curing agent) with a shell formed from a methyl(meth)acrylate resin or a styrene resin (e.g., "EPCAT-P" and "EPCAT-PS"; Nippon Kayaku Co., Ltd.), a latent heat-curing agent which is produced by coating a heat-curing agent such as an amine with a shell formed from a polyurea-type polymer or a radical polymer, a latent heat-curing agent which is produced by dispersing a heat-curing agent such as a modified imidazole in an epoxy resin, enclosing the heat-curing agent in the epoxy resin and then pulverizing the enclosed product, a latent heat-curing agent which is produced by dispersing a heat-curing agent in a thermoplastic polymer and thereby including the heat-curing agent in the thermoplastic polymer, and an imidazole latent heat-curing agent which is coated with a tetrakisphenol-type compound or the like (e.g., "TEP-2E4MZ" and "HIPA-2E4MZ"; Nippon Soda Co., Ltd.).

From the viewpoint of the further reduction in change in viscosity upon warming and the further extension of the pot life, the heat-curing agent (D) is preferably at least one compound selected from the group consisting of dicyandiamide, a hydrazide compound, an imidazole compound and a compound having a triazine ring.

Specific examples of the imidazole compound include 2-undecylimidazole, 2-heptadecylimidazole, 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanulate adduct, a 2-phenylimidazoleisocyanuric acid adduct, a 2-methylimidazoleisocyanuric acid adduct, 2-phenyl-4,5-dihydroxymethylimidazole and 2-phenyl-4-methyl-5-dihydroxymethylimidazole.

Specific examples of the compound having a triazine ring include melamine, melamine cyanurate, TEPIC-S (Nissan Chemical Industries, Ltd.) and 2,4,6-tri(6'-hydroxy-1'-hexylamino)triazine.

For the purpose of preventing the sedimentation of dicyandiamide particles or hydrazide compound particles or the clogging of a nozzle, it may be possible to react dicyandiamide or hydrazide compound particles with a functional-group-containing compound having a functional group capable of reacting with dicyandiamide or the hydrazide compound (e.g., a compound having a cyclic ether group) to cause dicyandiamide or the hydrazide compound particles to be dissolved in the composition. In this case, the pot life of the composition is good. Therefore, the heat-curing agent (D) is preferably a viscous reaction product produced by reacting dicyandiamide or a hydrazide compound with a functional-group-containing compound having a functional group capable of reacting with dicyandiamide or the hydrazide compound.

The compound having a cyclic ether group which is to be reacted with dicyandiamide or the hydrazine compound is preferably a compound having one cyclic ether group.

Specific example of the compound having a cyclic ether group which is to be reacted with dicyandiamide or the hydrazine compound include: a glycidyl ether compound such as phenylglycidyl ether, butylglycidyl ether, ortho-cresyl glycidyl ether, meta-cresyl glycidyl ether, para-cresyl glycidyl ether, allyl glycidyl ether and para-t-butylphenyl glycidyl ether; and glycidyl(meth)acrylate and 3,4-epoxycyclohexylmethyl(meth)acrylate.

In the reaction of dicyandiamide with the functional-group-containing compound, it is preferred that 0.2 mol or more and 4 mol or less of the functional-group-containing compound is reacted with 1 mol of dicyandiamide. The functional-group-containing compound may be reacted in an amount of 6 mol or less or 5 mol or less with 1 mol of dicyandiamide. In the reaction of the hydrazide compound with the functional-group-containing compound, it is preferred that the functional-group-containing compound is reacted in an amount of 0.2 mol or more, more preferably 2 mol or more, and preferably 6 mol or less, more preferably 5 mol or less, with 1 mol of the hydrazide compound. When the amount of the functional-group-containing compound used is less than the lower limit, an unreacted portion of dicyandiamide or the hydrazide compound might be precipitated. When the amount of the functional-group-containing compound used is more than the upper limit, most of active hydrogen in the viscous reaction product tends to be deactivated, and the curing of the compound having a cyclic ether group (C) might become difficult. In the reaction, if required, it is preferred that the reaction is carried out in the presence of a solvent or a reaction accelerator at 60 to 140° C.

In the reaction of dicyandiamide or the hydrazide compound with the functional-group-containing compound, for the purpose of dissolving dicyandiamide or the hydrazide compound, a solvent may be used. The solvent may be any one, as long as the solvent can dissolve dicyandiamide or the hydrazide compound. Examples of the solvent that can be used include acetone, methyl ethyl ketone, dimethylformamide and methyl cellosolve.

For the purpose of accelerating the reaction of dicyandiamide or the hydrazide compound with the functional-group-containing compound, a reaction accelerator may be used. As the reaction accelerator, a conventional known reaction accelerator such as a phenol compound, an amine compound, an imidazole compound and triphenylphosphine can be used.

From the viewpoint of the further improvement in inkjet ejection properties, the viscous reaction product is preferably not solid, is preferably not crystalline, and is preferably not crystalline solid. The viscous reaction product is preferably liquid or semi-solid.

The viscous reaction product is preferably transparent or translucent. Whether or not the viscous reaction product is transparent or translucent can be determined by whether or not an object is visible by naked eyes when the object is observed through the viscous reaction product having a thickness of 5 mm.

The ratio of the amount of the compound having a cyclic ether group (C) to the amount of the heat-curing agent (D) to be added is not particularly limited. The amount of the heat-curing agent (D) to be added is properly controlled so that the curable composition can be cured properly by the application of heat, and is not particularly limited. The content of the heat-curing agent (D) is preferably 5 parts by weight or more, more preferably 10 parts by weight or more, and preferably 60 parts by weight or less, more preferably 50 parts by weight or less, relative to 100 parts by weight of the compound having a cyclic ether group (C).

[Color Material (E)]

The curable composition for inkjet according to the present invention contains a color material (E). When the color material (E) is contained in the curable composition for inkjet, the pot life under the condition having a temperature of 50° C. or more can be extended. The color material (E) contained in the curable composition for inkjet is not particularly limited, as long as the color material (E) cannot be dissolved in the polyfunctional compound (A) and is dissolved in the curable composition for inkjet. As the color material (E), only one type may be used, or a combination of at least two types may also be used.

From the viewpoint of the further improvement in the storage stability of the curable composition for inkjet and the further extension of the pot life, it is preferred that the color material (E) can be dissolved in the compound having a cyclic ether group (C).

Whether or not the color material (E) is dissolved in the polyfunctional compound (A), the compound having a cyclic ether group (C) and the curable composition for inkjet can be determined in the following manner.

One-hundred grams of a mixture produced by mixing the polyfunctional compound (A) or the compound having a cyclic ether group (C) with the color material (E) at 25° C. at a weight ratio of 90:10 or 100 g of the curable composition for inkjet is filtered through a mesh filter having a diameter of 1 cm and a mesh size of 1 μm at 100 hPa. In the filtration step, when the whole volume is filtered within 5 minutes, it is determined that the color material (E) "can be dissolved". When the whole volume is not filtered within 5 minutes, it is determined that the color material (E) "cannot be dissolved".

The color material (E) is preferably a dye. From the viewpoint of the further improvement in the storage stability of the curable composition for inkjet and the further extension of the pot life of the curable composition for inkjet, it is preferred that the color material (E) has a sulfone group.

Specific examples of the color material (E) include a phthalocyanine compound, an anthraquinone compound and an azo compound.

Specific examples of the phthalocyanine compound include copper phthalocyanine and iron phthalocyanine.

Specific examples of the anthraquinone compound include alizarin and dihydroxyanthraquinone.

Specific examples of the azo compound include p-(phenylazo)phenol and 1,5-dioxynaphthalene.

Examples of the commercially available products of the phthalocyanine compound include 650M, valifest 2610, valifest 2620, valifest blue1605 and valifest blue 2670 which are products manufactured by Orient Chemical Industries.

An example of the commercially available product of the anthraquinone compound is NUBIAN BLUE PS-5630 which is a product manufactured by Orient Chemical Industries.

Examples of the commercially available products of the azo compound include valifest black 3804, valifest black 3820 and valifest black 3870 which are products manufactured by Orient Chemical Industries.

The amount of the color material (E) to be added is properly controlled in such a manner that the cured product has a desired color or with taking the curability and storage stability of the curable composition into consideration, and is not limited particularly. The content of the color material (E) is preferably 0.01% by weight or more, preferably 3% by weight or less, in 100% by weight of the curable composition for inkjet.

(Polymerization Inhibitor (F))

From the viewpoint of the further improvement in storage stability and the further extension of the pot life, it is preferred that the curable composition for inkjet contains a polymerization inhibitor (F). As the polymerization inhibitor (F), only one type may be used, or a combination of at least two types may also be used.

Examples of the polymerization inhibitor (F) include hydroquinone, hydroquinone monomethyl ether, tert-butylcatechol, pyrogallol and phenothiazine.

The amount of the polymerization inhibitor (F) to be added is properly controlled with taking the reactivity of the polyfunctional compound (A) into consideration, and is not limited particularly. The content of the polymerization inhibitor (F) is preferably 0.02% by weight or more, preferably 0.1% by weight or less, in 100% by weight of the curable composition for inkjet.

(Monofunctional Compound (G))

It is preferred that the curable composition for inkjet contains a monofunctional compound (G) having a polycyclic skeleton and also having one (meth)acryloyl group. It is more preferred that the curable composition for inkjet contains a polyfunctional compound (A1) having a polycyclic skeleton and also having at least two (meth)acryloyl groups and a monofunctional compound (G) having a polycyclic skeleton and also having one (meth)acryloyl group. In this case, the wet heat resistance of the cured product of the curable composition for inkjet is remarkably increased. Therefore, an electronic part, such as a printed wiring board, which is manufactured using the curable composition for inkjet can be used for a longer period of time and the reliability of the electronic part is further improved. Furthermore, when the monofunctional compound (G) is used, the wet heat resistance of the cured product can be improved and the ejection properties of the curable composition can also be improved. When a monofunctional compound (G) having a polycyclic skeleton and also having one (meth) acryloyl group is used, the wet heat resistance of the cured product can become higher compared with the case in which a monofunctional compound having no polycyclic skeleton and having one (meth)acryloyl group is used.

The monofunctional compound (G) is not limited particularly, as long as the monofunctional compound (G) has a polycyclic skeleton and also has one (meth)acryloyl group. As the monofunctional compound (G), a conventional known monofunctional compound having a polycyclic skeleton and also having one (meth)acryloyl group can be used. As the monofunctional compound (G), only one type may be used, or a combination of at least two types may also be used.

Specific examples of the monofunctional compound (G) include isobornyl(meth)acrylate, dihydroxycyclopentadienyl(meth)acrylate, dicyclopentenyl(meth)acrylate, dicyclopentenyloxyethyl(meth)acrylate, dicyclopentanyl(meth) acrylate and naphthyl(meth)acrylate. Among these compounds, from the viewpoint of the further improvement in wet heat resistance of the cured product, the monofunctional compound (G) is preferably at least one compound selected from the group consisting of isobornyl(meth)acrylate, dihydroxycyclopentadienyl(meth)acrylate, dicyclopentenyl(meth)acrylate, dicyclopentenyloxyethyl(meth)acrylate and dicyclopentanyl(meth)acrylate.

The content of the monofunctional compound (G) is preferably 5% by weight or more, more preferably 15% by weight or more, and preferably 50% by weight or less, more preferably 45% by weight or less, in 100% by weight of the curable composition for inkjet.

The content of the monofunctional compound (G) is preferably 5% by weight or more, more preferably 15% by weight or more, and preferably 50% by weight or less, more preferably 45% by weight or less, still more preferably 42% by weight or less, in the total amount, i.e., 100% by weight, of the polyfunctional compound (A1), the monofunctional compound (G) and the photopolymerization initiator (B). When the content of the monofunctional compound (G) is equal to or more than the lower limit, the wet heat resistance of the cured product can be further improved. When the content of the monofunctional compound (G) is equal to or lower than the upper limit, the curable composition can be cured more effectively by the irradiation with light.

The upper limit of the total content of the polyfunctional compound (A1) and the monofunctional compound (G) in 100% by weight of the curable composition for inkjet is properly controlled depending on the content of the photopolymerization initiator (B).

[Other Components]

The curable composition for inkjet may contain a curing accelerator.

Examples of the curing accelerator include a tertiary amine, an imidazole, a quaternary ammonium salt, a quaternary phosphonium salt, an organic metal salt, a phosphorus compound and a urea compound.

In the curable composition for inkjet according to the present invention, various additives may be contained in amount ranges that do not interfere with the object of the present invention. The additives are not particularly limited, and an antifoaming agent, a leveling agent, an adhesiveness-imparting agent and the like can be mentioned. The curable composition for inkjet according to the present invention may also contain an organic solvent in a small amount.

Examples of the antifoaming agent include a silicone-type antifoaming agent, a fluorine-containing antifoaming agent and a polymer-type antifoaming agent. Examples of the leveling agent include a silicone-type leveling agent, a fluorine-containing leveling agent and a polymer-type leveling agent. Examples of the adhesiveness-imparting agent include an imidazole-type adhesiveness-imparting agent, a thiazole-type adhesiveness-imparting agent, a triazole-type adhesiveness-imparting agent and a silane coupling agent.

In the curable composition for inkjet according to the present invention, it is preferred that the viscosity $\eta 1$ as measured at 25° C. in accordance with JIS K2283 is 160 mPa·s or more and 1200 mPa·s or less. When the viscosity $\eta 1$ of the curable composition for inkjet is equal to or more than the lower limit and is equal to or lower than the upper limit, the curable composition for inkjet can be ejected through an inkjet head easily and with high accuracy. Furthermore, when the curable composition for inkjet is warmed to 50° C. or higher, the composition can also be ejected through an inkjet head easily and with high accuracy.

The viscosity $\eta 1$ is more preferably 1000 mPa·s or less, still more preferably 500 mPa·s or less. When the viscosity satisfies the above-mentioned preferred upper limit, the ejection properties of the curable composition can become better upon the continuous ejection through the head. Furthermore, from the viewpoint of the further prevention of the wet-spreading of the curable composition and the further improvement in resolution in the formation of the cured product layer, the viscosity is preferably more than 500 mPa·s.

The ratio ($\eta 2/\eta 1$) of the viscosity $\eta 2$ of the curable composition for inkjet according to the present invention, which is measured after heating the curable composition at 80° C. for 24 hours under an oxygen-free condition, to the above-mentioned viscosity $\eta 1$ is preferably 1.1 or less, more preferably 1.05 or less, particularly preferably 1.025 or less. When the ratio ($\eta 2/\eta 1$) is equal to or lower than the upper limit, the storage stability of the curable composition is high and the pot life of the curable composition is sufficiently long. Although the ratio ($\eta 2/\eta 1$) is generally 1 or more, the ratio ($\eta 2/\eta 1$) may be 0.95 or more. The viscosity $\eta 2$ can be measured in the same manner as for the viscosity $\eta 1$.

It is preferred that the curable composition for inkjet according to the present invention does not contain an organic solvent or, alternatively, contains an organic solvent wherein the content of the organic solvent is 50% by weight or less in 100% by weight of the curable composition. The content of the organic solvent is more preferably 20% by weight or less, still more preferably 10% by weight or less, particularly preferably 1% by weight or less, in 100% by weight of the curable composition. The less the content of the organic solvent is, the better the resolution in the formation of the cured product layer is.

It is preferred that the curable composition for inkjet according to the present invention does not contain an organic solvent or, alternatively, contains an organic solvent wherein the content of the organic solvent is 50 parts by weight or less relative to 100 parts by weight of the heat-curing agent (D). The content of the organic solvent is more preferably 20 parts by weight or less, still more preferably 10 parts by weight or less, particularly preferably 1 part by weight or less, relative to 100 parts by weight of the heat-curing agent (D). The less the content of the organic solvent is, the better the resolution in the formation of the cured product layer is.

(Method for Manufacturing Electronic Part)

Hereinbelow, the method for producing an electronic part according to the present invention will be described.

In the method for producing the electronic part according to the present invention, the above-mentioned curable composition for inkjet is used. That is, in the method for producing the electronic part according to the present invention, the curable composition for inkjet is firstly applied in an inkjet mode to draw a pattern. In this procedure, it is particularly preferred that the curable composition for inkjet is applied directly to form the pattern. The term “applied directly” refers to a matter that the curable composition is applied without using a mask to draw the pattern. Examples of the electronic part include a printed wiring board and a touch panel part. The electronic part is preferably a wiring board, and is more preferably a printed wiring board.

For the application of the curable composition for inkjet, an inkjet printer is used. The inkjet printer is equipped with an inkjet head. The inkjet head has a nozzle. An inkjet device is preferably equipped with a warming unit for warming the inside of the inkjet device or the inside of the inkjet head to a temperature of 50° C. or higher. It is preferred that the curable composition for inkjet is applied onto an application object member. An example of the application object member is a substrate. An example of the substrate is a substrate having a wiring line or the like formed on the upper surface thereof. It is preferred that the curable composition for inkjet is applied onto a printed circuit board.

According to the method for producing the electronic part according to the present invention, it is possible to produce a glass substrate for a display device such as a liquid crystal display device using, instead of the substrate, a member mainly composed of a glass. Specifically, it is also possible to form electrically conductive patterns such as an ITO on a glass by a method such as a deposition method and then form a cured product layer on the electrically conductive patterns in an inkjet mode by the method for producing the electronic part according to the present invention. When the patterns are formed with an electrically conductive ink or the like on the cured product layer, the cured product layer serves as an insulation film and electric connection can be achieved between given patterns among the electrically conductive patterns on the glass.

Subsequently, the curable composition for inkjet that is applied in a pattern-like form is irradiated with light and then applied with heat to cure the curable composition, thereby forming a cured product layer. In this manner, an electronic part having the cured product layer can be produced. The cured product layer may be an insulation film or a resist pattern. The insulation film may be a pattern-like insulation film. The cured product layer is preferably a resist pattern. The resist pattern is preferably a solder resist pattern.

The method for producing the electronic part according to the present invention is preferably a method for producing a printed wiring board having a resist pattern. It is preferred that the curable composition for inkjet is applied in an inkjet mode to draw patterns, the curable composition for inkjet that is applied in a pattern-like form is irradiated with light and then applied with heat to cure the curable composition, thereby forming a resist pattern.

It may also be possible to irradiate the curable composition for inkjet that is applied in a pattern-like form with light to cause the primary curing of the curable composition, thereby producing a primary cured product. In this case, the wet-spreading of the applied curable composition for inkjet can be prevented and highly precise resist patterns can be formed. When a primary curing product is produced by the irradiation with light, it may be possible to carry out the main curing by applying heat to the primary cured product to produce a cured product, thereby forming a cured product layer such as a resist pattern. The curable composition for inkjet according to the present invention can be cured by the irradiation with light and the application of heat. When the curing with light and the curing by heat are used in combination, a cured product layer, such as a resist pattern, having superior heat resistance can be formed. The temperature to be employed for the curing by the application of heat is preferably 100° C. or higher, more preferably 120° C. or higher, and preferably 250° C. or lower, more preferably 200° C. or lower.

The irradiation with light may be carried out after the drawing of the pattern, or may be carried out simultaneously with the drawing of the pattern. For example, the irradiation with light may be carried out simultaneously with or immediately after the ejection of the curable composition. For the purpose of carrying out the irradiation with light simultaneously with the drawing of the pattern, it may be possible to place a light source at such a position that a light-irradiated part can be positioned at a drawing position by means of an inkjet head.

The light source to be employed for the irradiation with light can be properly selected depending on the light to be employed for the irradiation. Examples of the light source include an UV-LED, a low-pressure mercury lamp, a medium-pressure mercury lamp, a high-pressure mercury lamp, an ultrahigh-pressure mercury lamp, a xenon lamp and a metal halide lamp. The light to be employed for the irradiation is generally ultraviolet ray, and may also be electron beam, α-ray, β-ray, γ-ray, X-ray, neutron ray or the like.

The temperature to be employed in the application of the curable composition for inkjet is not particularly limited, as long as the curable composition for inkjet can have such a viscosity that the curable composition can be ejected through an inkjet head at that temperature. The temperature to be employed in the application of the curable composition for inkjet is preferably 50° C. or higher, more preferably 60° C. or higher, and preferably 100° C. or lower. The viscosity of the curable composition for inkjet during application is not particularly limited, as long as the curable composition can be ejected through an inkjet head at the viscosity.

It may also be possible to employ a method of cooling the substrate during printing. When the substrate is cooled, the viscosity of the curable composition during spotting can be increased and, consequently, the resolution can be improved. In this case, it is preferred that the cooling is carried out to such an extent that dew drops cannot be formed or, alternatively, the atmospheric air is dehumidified so as to prevent the formation of dew drops. The dimensional accuracy may be corrected, since the substrate shrinks upon cooling.

When a viscous material such as the above-mentioned viscous reaction product is used as the heat-curing agent (D), even if the curable composition for inkjet is heated in the inkjet head, the pot life of the curable composition for inkjet can become sufficiently long and, therefore, stably ejection of the curable composition can be achieved. Furthermore, since the curable composition for inkjet can be heated to such an extent that the curable composition has a viscosity suitable for the application in an inkjet mode, it becomes possible to suitably manufacture an electronic part such as a printed wiring board using the curable composition for inkjet according to the present invention.

Hereinbelow, the present invention will be described concretely with reference to Examples and Comparative Examples. The present invention is not intended to be limited to Examples described below.

Synthetic Example 1

Methyl cellosolve (50 g), dicyandiamide (15 g) and 2,4-diamino-6-[2'-undecylimidazolyl-(1')]-ethyl-s-triazine (1 g) were added to a three-necked flask equipped with a stirrer, a thermometer and a dropping funnel and then heated to 100° C., thereby dissolving dicyandiamide therein. After the dissolution, butyl glycidyl ether (130 g) was added dropwise through the dropping funnel over 20 minutes, and the mixture was reacted for 1 hour. Thereafter, the temperature was decreased to 60° C., the pressure was reduced to remove the solvent, thereby producing a yellow and translucent viscous reaction product. The resultant viscous reaction product did not contain the solvent.

Synthetic Example 2

Methyl cellosolve (150 g), adipic acid dihydrazide (15 g) and 2,4-diamino-6-[2'-methyl imidazolyl-(1')]-ethyl-s-triazine (0.3 g) were added to a three-necked flask equipped with a stirrer, a thermometer and a dropping funnel and then heated to 130° C., thereby dissolving adipic acid dihydrazide therein. After the dissolution, phenyl glycidyl ether (40 g) was added dropwise through the dropping funnel over 20 minutes, and the mixture was reacted for 6 hours. Thereafter, the temperature was decreased to 80° C., the pressure was reduced to remove the solvent, thereby producing a red and translucent viscous reaction product. The resultant viscous reaction product did not contain the solvent In Examples and Comparative Examples, the color materials (E) and the other color materials mentioned below were used.

(Color Materials (E))

650M (Orient Chemical Industries, a phthalocyanine compound, a sulfonamide, amine free)

Valifast 2610 (Orient Chemical Industries, a phthalocyanine compound, a sulfonamide)

Valifast 2620 (Orient Chemical Industries, a phthalocyanine compound)

NUBIAN BLUE PS-5630 (Orient Chemical Industries, an anthraquinone compound)

elixa black 803 (Orient Chemical Industries)

elixa black 840 (Orient Chemical Industries)

elixa black 846 (Orient Chemical Industries)

elixa green 502 (Orient Chemical Industries)

elixa green 540 (Orient Chemical Industries)

valifest blue 1605 (Orient Chemical Industries, a phthalocyanine compound)

valifest blue 2670 (Orient Chemical Industries, a phthalocyanine compound)

valifest black 3804 (Orient Chemical Industries, an azo compound)

valifest black 3820 (Orient Chemical Industries, an azo compound)

valifest black 3870 (Orient Chemical Industries, an azo compound)

valifest green 1501 (Orient Chemical Industries)

(Other Color Materials)

4930 (Dainichiseika Color & Chemicals Mfg. Co., Ltd., a phthalocyanine compound)

Elixa blue 648 (Orient Chemical Industries, an anthraquinone compound)

elixa red 348 (Orient Chemical Industries)

elixa yellow 129 (Orient Chemical Industries)

solbon black cr800 (Orient Chemical Industries, an azine-type compound)

bonjet black cw-1 (Orient Chemical Industries, carbon black)

(Evaluation of Solubility 1 of Color Materials)

Each of the polyfunctional compounds (A) and each of the color materials (E) or the other color materials, which were used in the below-mentioned Examples and Comparative Examples, were mixed with each other at a weight ratio of 90:10 at 25° C., thereby providing a first mixture (100 g). Each of the compounds each having a cyclic ether group (C) and the color materials (E) or the other color materials, which were used in the below-mentioned Examples and Comparative Examples, were mixed with each other at a weight ratio of 90:10 at 25° C., thereby providing a second mixture (100 g).

Each of the first mixtures and the second mixtures (100 g each) was filtered through a mesh filter having a diameter of 1 cm and a mesh size of 1 μm at 100 hPa, and the solubility 1 of each of the color materials was evaluated on the basis of the criteria shown below.

[Determination Criteria for Solubility 1 of Color Materials]

A: The whole volume was filtered within 5 minutes (the color material could be dissolved).

B: The whole volume was not filtered within 5 minutes (the color material was not dissolved).

With respect to the materials used in the below-mentioned Examples and Comparative Examples, when the same color material was used, no difference was observed in the results of the solubility of the color material between samples prepared using the polyfunctional compounds (A) and samples prepared using the compounds each having a cyclic ether group (C). Differences were observed depending on the types of the color materials used.

The results of the evaluation of the solubility of the color materials are shown in Table 1 below.

TABLE 1

| | | Evaluation of solubility 1 of color material | |
|---|---|---|---|
| | | Solubility in component (A) | Solubility in component (C) |
| Color materials (E) | 650M | B | A |
| | valifast 2610 | B | A |
| | Valifast 2620 | B | A |
| | NUBIAN BLUE PS-5630 | B | A |
| | elixa black 803 | B | A |
| | elixa black 840 | B | A |
| | elixa black 846 | B | A |
| | elixa green 502 | B | A |
| | elixa green 540 | B | A |
| | valifast blue 1605 | B | A |
| | valifast blue 2670 | B | A |
| | valifast black 3804 | B | A |
| | valifast black 3820 | B | A |
| | valifast black 3870 | B | A |
| | valifast green 1501 | B | A |
| Other color materials | #4930 | B | B |
| | elixa red 348 | A | B |
| | Elixa blue 648 | A | A |
| | solbon black cr800 | A | B |
| | bonjet black cw-1 | A | B |

Example 1

Tricyclodecanedimethanol diacrylate (Daicel-Allnex Ltd., "IRR214-K") (85 parts by weight) (which corresponds to the polyfunctional compound (A)), an α-aminoalkylphenone-type photo-radical polymerization initiator (BASF Japan Ltd., "IRGACURE 907") (5 parts by weight) (which corresponds to the photopolymerization initiator (B)), a bisphenol A-type epoxy resin (Nippon Steel & Sumikin Chemical Co., Ltd., "YD-127") (15 parts by weight) (which corresponds to the compound having a cyclic ether group (C)), the viscous reaction product produced in Synthetic example 1 (10 parts by weight), and 650M (Orient Chemical Industries, a phthalocyanine compound) (1 part by weight) (which corresponds to the color material (E)) were mixed together, thereby producing a curable composition for inkjet.

Examples 2 to 34 and Comparative Examples 1 to 6

The same procedure as in Examples 1 was carried out, except that the types and amounts of the blend components were changed to those shown in Tables 2 to 6, thereby producing curable compositions for inkjet.

(Evaluation of Examples and Comparative Examples)

(1) Viscosity

The viscosities η1 of the curable compositions for inkjet were measured at 25° C. immediately after the production of the curable compositions in accordance with JIS K2283 using a viscometer (Toki Sangyo Co., Ltd., "TVE22L"). The viscosities η1 of the curable compositions for inkjet were determined on the basis of the determination criteria shown below.

[Determination Criteria for Determination of Viscosities]

A: The viscosity η1 was more than 1200 mPa·s.

B: The viscosity η1 was more than 1000 mPa·s and 1200 mPa·s or less.

C: The viscosity η1 was more than 500 mPa·s and 1000 mPa·s or less.

D: The viscosity η1 was 160 mPa·s or more and 500 mPa·s or less.

E: The viscosity η1 was less than 160 mPa·s.

(2) Increase in Viscosity (Storage Stability and Length of Pot Life)

The viscosities η1 of the curable compositions for inkjet were measured at 25° C. immediately after the production of the curable compositions in accordance with JIS K2283 using a viscometer (Toki Sangyo Co., Ltd., "TVE22L"). Subsequently, each of the curable compositions for inkjet was heated at 80° C. for 24 hours immediately after the production of the curable compositions. The viscosities η2 of the heated curable compositions for inkjet were measured in the same manner as for the determination of the viscosities η1. The increase in viscosity was determined on the basis of the determination criteria shown below.

[Determination Criteria for Increase in Viscosity]

○○: The ratio (η2/η1) was 1 or more and 1.025 or less.

○: The ratio (η2/η1) was more than 1.025 and 1.05 or less.

Δ: The ratio (η2/η1) was more than 1.075 and 1.1 or less.

x: The ratio (η2/η1) was more than 1.1 and 3 or less.

(3) Inkjet Ejection Properties

An ejection test on the produced curable compositions for inkjet was carried out through an inkjet head of a piezo-type inkjet printer equipped with an ultraviolet ray irradiation device, and the evaluation was carried out on the basis of the determination criteria shown below. In the ejection test on some of the curable compositions each of which had a viscosity of 500 mPa·s or less, the head temperature was set to 80° C. In the ejection test on some of the curable compositions each of which had a viscosity of more than 500 mPa·s, the head temperature was set to 95° C.

[Determination Criteria for Inkjet Ejection Properties]

○○: The curable composition could be ejected through the head continuously for 10 hours or longer.

○: The curable composition could be ejected through the head continuously for 10 hours or longer, but slight non-uniformity in the ejection was observed during the continuous ejection.

Δ: The curable composition could be ejected through the head continuously, but could not be ejected continuously for 10 hours or longer.

x: The curable composition could not be ejected through the head at the initial stage.

(4) Wet-Spreadability

A copper-foil-attached FR-4 substrate which had a copper foil attached on the upper surface thereof was provided. Each of the curable compositions for inkjet was ejected and applied onto the copper foil of the substrate through an inkjet head of a piezo-type inkjet printer equipped with an ultraviolet ray irradiation device at a line width of 80 μm and a line spacing of 80 μm in such a manner that each of the curable compositions covered the surface of the copper foil, thereby drawing a pattern. In the ejection test on some of the curable compositions for inkjet each of which had a viscosity of 500 mPa·s or less, the head temperature was set to 80° C. In the ejection test on some of the curable compositions for inkjet each of which had a viscosity of more than 500 mPa·s, the head temperature was set to 95° C.

Each of the curable compositions for inkjet (thickness: 20 μm), which was applied on the substrate, was irradiated with ultraviolet ray having a wavelength of 365 nm in such a manner that the irradiation energy became 1000 mJ/$cm^2$.

Five minutes after the irradiation with ultraviolet ray, the state of wet-spreading of the pattern was observed with naked eyes, and the degree of wet-spreading was determined on the basis of the determination criteria shown below.

[Determination Criteria for Wet-Spreadability]

○○: The wet-spreading was kept within the target line width+40 μm or less.

○: The wet-spreading extended across the target line width+40 μm and lied within the target line width+75 μm or less.

x: The composition layer was spread in a wet state from the applied part and there was no spacing between lines, or the wet-spreading extended across the target line width+75 μm.

(5) Length of Pot Life

Each of the curable compositions for inkjet was filtered using a 5-μm membrane filter, the filtered portion of each of the curable compositions for inkjet was heated to 80° C. for 12 hours.

A copper-foil-attached FR-4 substrate which had a copper foil attached on the upper surface thereof was provided. For the purpose of forming a pattern using each of the curable compositions for inkjet, each of the curable compositions for inkjet was ejected and applied onto the substrate through an inkjet head of a piezo-type inkjet printer equipped with an ultraviolet ray irradiation device in such a manner that the line width became 80 μm and the line spacing became 80 μm. The length of pot life was determined from the ejection properties through the inkjet head on the basis of the determination criteria shown below. In the ejection test on some of the curable compositions for inkjet each of which had a viscosity of 500 mPa·s or less, the head temperature was set to 80° C. In the ejection test on some of the curable compositions for inkjet each of which had a viscosity of more than 500 mPa·s, the head temperature was set to 95° C.

[Determination Criteria for Pot Life]

○○: The composition could be ejected through the inkjet head.

○: The curing of the composition slightly proceeded before the ejection, or the composition could be ejected through the inkjet head although the viscosity of the composition was slightly increased.

Δ: The composition was cured before the ejection, or the viscosity of the composition was increased and the composition could not be ejected through the inkjet head.

x: The composition was cured to a large degree.

(6) Heat Resistance

A copper-foil-attached FR-4 substrate which had a copper foil attached on the upper surface thereof was provided. Each of the curable compositions for inkjet was ejected and applied onto the copper foil of the substrate through an inkjet head of a piezo-type inkjet printer equipped with an ultraviolet ray irradiation device at a line width of 80 μm and a line spacing of 80 μm in such a manner that each of the curable compositions covered the surface of the copper foil, thereby drawing a pattern. In the ejection test on some of the curable compositions for inkjet each of which had a viscosity of 500 mPa·s or less, the head temperature was set to 80° C. In the ejection test on some of the curable compositions for inkjet each of which had a viscosity of more than 500 mPa·s, the head temperature was set to 95° C.

Each of the curable compositions for inkjet (thickness: 20 μm), which was applied in a pattern-like form, was irradiated with ultraviolet ray having a wavelength of 365 nm in such a manner that the irradiation energy became 1000 mJ/cm$^2$, thereby producing a primary cured product. Subsequently, the primary cured product was heated at 150° C. for 60 minutes to cause the main curing of each of the curable compositions, thereby producing a resist pattern which was a main cured product.

The resultant laminate of the substrate and the resist pattern was heated in an oven at 270° C. for 5 minutes, and subsequently the appearance of the heated resist pattern was inspected with naked eyes. Thereafter, a cellophane tape was adhered to the heated resist pattern, and then the cellophane tape was peeled in the 90 degree direction. The heat resistance was determined by the appearance test and the peel test on the basis of the criteria shown below.

[Determination Criteria for Heat Resistance]

○: No change was observed in the resist pattern before and after the heating in the appearance test, and the resist pattern was not detached from the substrate in the peel test.

x: At least one phenomenon selected from cracking, detachment and blistering was observed in the resist pattern in the appearance test, or the resist pattern was detached from the substrate in the peel test.

(7) Evaluation of Solubility 2 of Color Material in Curable Composition

A portion (100 g) of each of the curable compositions for inkjet produced in Examples and Comparative Examples was provided. The portion (100 g) of each of the curable compositions for inkjet was filtered through a mesh filter having a diameter of 1 cm and a mesh size of 1 μm at 100 hPa, and the solubility 2 of a color material in each of the curable compositions was determined on the basis of the criteria shown below.

[Determination Criteria for Solubility 2 of Color Material in Curable Composition]

○○: The curable material could be filtered within 1 minute.

○: The curable material could be filtered within a time range of longer than 1 minute and 3 minutes or shorter.

Δ: The curable material could be filtered within a time range of longer than 3 minutes and 5 minutes or shorter.

x: The curable material could not be filtered within 5 minutes.

The results are shown in Tables 2 to 6. In the results, unheated curable compositions for inkjet were used in evaluations other than the evaluation of the viscosities η2 and the evaluation of pot lives.

TABLE 2

| | | Product Nos. | | Ex. 1 | Ex. 2 | Ex. 3 | Ex. 4 | Ex. 5 | Ex. 6 | Ex. 7 | Ex. 8 |
|---|---|---|---|---|---|---|---|---|---|---|---|
| Blend components (part by weight) | Component (C) | YD-127 | Bisphenol A-type epoxy resin | 15 | 15 | 15 | 15 | 15 | 15 | 15 | 15 |
| | | YDF-170 | Bisphenol F-type epoxy resin | | | | | | | | |
| | | EX-211 | Neopentyl glycol diglycidyl ether | | | | | | | | |
| | | JER630 | Glycidylamine-type epoxy resin | | | | | | | | |
| | | JER152 | Phenol novolac-type epoxy resin | | | | | | | | |
| | | TETRAD-X | Glycidylamine-type epoxy resin | | | | | | | | |
| | | TETRAD-C | Glycidylamine-type epoxy resin | | | | | | | | |
| | Component (A) | IRR214-K | Tricyclodecanedimethanol diacrylate | 85 | 85 | 85 | 85 | 85 | 85 | 85 | 85 |
| | | TMPTA | Trimethylolpropane triacrylate | | | | | | | | |
| | | 1,9-HDDA | 1,9-Hexanediol diacrylate | | | | | | | | |
| | | 1,9-NDDA | 1,9-Nonanediol diacrylate | | | | | | | | |
| | | NP-A | Neopentyl glycol diacrylate | | | | | | | | |
| | | 4EG-A | PEG200 diacrylate | | | | | | | | |
| | | 9EG-A | PEG400 diacrylate | | | | | | | | |
| | | 16EG-A | PEG600 diacrylate | | | | | | | | |
| | | MPD-A | 3-Methyl-1,5-pentanediol diacrylate | | | | | | | | |
| | Component (B) | IRGACURE 907 | α-Aminoalkylphenone-type photo-radical polymerization initiator | 5 | 5 | 5 | 5 | 5 | 5 | 5 | 5 |
| | | IRGACURE 369 | α-Aminoalkylphenone-type photo-radical polymerization initiator | | | | | | | | |
| | | IRGACURE 379EG | α-Aminoalkylphenone-type photo-radical polymerization initiator | | | | | | | | |
| | | TPO | Acylphosphine oxide-type photo-radical polymerization initiator | | | | | | | | |
| | Component (D) | Viscous reaction product produced in Synthetic example 1 | | 10 | 10 | 10 | 10 | 10 | 10 | 10 | 10 |
| | | Viscous reaction product produced in Synthetic example 2 | | | | | | | | | |
| | Component (E) | 650M | Phthalocyanine compound | 1 | | | | | | | |
| | | valifast 2610 | Phthalocyanine compound | | 1 | | | | | | |

TABLE 2-continued

| | | Product Nos. | | Ex. 1 | Ex. 2 | Ex. 3 | Ex. 4 | Ex. 5 | Ex. 6 | Ex. 7 | Ex. 8 |
|---|---|---|---|---|---|---|---|---|---|---|---|
| | | Valifast 2620 | Phthalocyanine compound | | | 1 | | | | | |
| | | NUBIAN BLUE PS-5630 | Anthraquinone compound | | | | 1 | | | | |
| | | elixa black 803 | | | | | | 1 | | | |
| | | elixa black 840 | | | | | | | 1 | | |
| | | elixa black 846 | | | | | | | | 1 | |
| | | elixa green 502 | | | | | | | | | 1 |
| | | elixa green 540 | | | | | | | | | |
| | | valifast blue 1605 | Phthalocyanine compound | | | | | | | | |
| | | valifast blue 2670 | Phthalocyanine compound | | | | | | | | |
| | | valifast black 3804 | Azo compound | | | | | | | | |
| | | valifast black 3820 | Azo compound | | | | | | | | |
| | | valifast black 3870 | Azo compound | | | | | | | | |
| | | valifast green 1501 | | | | | | | | | |
| | Other color materials | #4930 | Phthalocyanine compound | | | | | | | | |
| | | Elixa blue 648 | Anthraquinone compound | | | | | | | | |
| | | elixa red 348 | | | | | | | | | |
| | | elixa yellow 129 | | | | | | | | | |
| | | solbon black cr800 | Azine-type compound | | | | | | | | |
| | | bonjet black cw-1 | Carbon black | | | | | | | | |
| Evaluation | (1) Viscosity | | | D | D | D | D | D | D | D | D |
| | (2) Increase in viscosity | | | ○○ | ○○ | ○○ | ○ | ○○ | ○○ | ○○ | ○○ |
| | (3) Inkjet ejection properties | | | ○○ | ○○ | ○○ | ○○ | ○○ | ○○ | ○○ | ○○ |
| | (4) Wet-spreadability | | | ○ | ○ | ○ | ○ | ○ | ○ | ○ | ○ |
| | (5) Length of pot life | | | ○○ | ○○ | ○○ | ○ | ○○ | ○○ | ○○ | ○○ |
| | (6) Heat resistance | | | ○ | ○ | ○ | ○ | ○ | ○ | ○ | ○ |
| | (7) Solubility 2 of color material in curable composition | | | ○○ | ○○ | ○○ | ○ | ○○ | ○○ | ○○ | ○○ |

TABLE 3

| | | Product Nos. | | Ex. 9 | Ex. 10 | Ex. 11 | Ex. 12 | Ex. 13 | Ex. 14 | Ex. 15 | Ex. 16 |
|---|---|---|---|---|---|---|---|---|---|---|---|
| Blend components (part by weight) | Component (C) | YD-127 | Bisphenol A-type epoxy resin | 15 | 15 | 15 | 15 | 15 | 15 | 15 | 15 |
| | | YDF-170 | Bisphenol F-type epoxy resin | | | | | | | | |
| | | EX-211 | Neopentyl glycol diglycidyl ether | | | | | | | | |
| | | JER630 | Glycidylamine-type epoxy resin | | | | | | | | |
| | | JER152 | Phenol novolac-type epoxy resin | | | | | | | | |
| | | TETRAD-X | Glycidylamine-type epoxy resin | | | | | | | | |
| | | TETRAD-C | Glycidylamine-type epoxy resin | | | | | | | | |
| | Component (A) | IRR214-K | Tricyclodecanedimethanol diacrylate | 85 | 85 | 85 | 85 | 85 | 85 | 85 | 85 |
| | | TMPTA | Trimethylolpropane triacrylate | | | | | | | | |
| | | 1,9-HDDA | 1,9-Hexanediol diacrylate | | | | | | | | |
| | | 1,9-NDDA | 1,9-Nonanediol diacrylate | | | | | | | | |
| | | NP-A | Neopentyl glycol diacrylate | | | | | | | | |
| | | 4EG-A | PEG200 diacrylate | | | | | | | | |
| | | 9EG-A | PEG400 diacrylate | | | | | | | | |
| | | 16EG-A | PEG600 diacrylate | | | | | | | | |
| | | MPD-A | 3-Methyl-1,5-pentanediol diacrylate | | | | | | | | |
| | Component (B) | IRGACURE 907 | α-Aminoalkylphenone-type photo-radical polymerization initiator | 5 | 5 | 5 | 5 | 5 | 5 | 5 | 5 |
| | | IRGACURE 369 | α-Aminoalkylphenone-type photo-radical polymerization initiator | | | | | | | | |
| | | IRGACURE 379EG | α-Aminoalkylphenone-type photo-radical polymerization initiator | | | | | | | | |
| | | TPO | Acylphosphine oxide-type photo-radical polymerization initiator | | | | | | | | |
| | Component (D) | Viscous reaction product produced in Synthetic example 1 | | 10 | 10 | 10 | 10 | 10 | 10 | 10 | 15 |
| | | Viscous reaction product produced in Synthetic example 2 | | | | | | | | | |
| | Component (E) | 650M | Phthalocyanine compound | | | | | | | | 1 |
| | | valifast 2610 | Phthalocyanine compound | | | | | | | | |
| | | Valifast 2620 | Phthalocyanine compound | | | | | | | | |
| | | NUBIAN BLUE PS-5630 | Anthraquinone compound | | | | | | | | |
| | | elixa black 803 | | | | | | | | | |
| | | elixa black 840 | | | | | | | | | |
| | | elixa black 846 | | | | | | | | | |
| | | elixa green 502 | | | | | | | | | |
| | | elixa green 540 | | 1 | | | | | | | |
| | | valifast blue 1605 | Phthalocyanine compound | | 1 | | | | | | |
| | | valifast blue 2670 | Phthalocyanine compound | | | 1 | | | | | |
| | | valifast black 3804 | Azo compound | | | | 1 | | | | |
| | | valifast black 3820 | Azo compound | | | | | 1 | | | |
| | | valifast black 3870 | Azo compound | | | | | | 1 | | |
| | | valifast green 1501 | | | | | | | | 1 | |

TABLE 3-continued

| | | Product Nos. | | Ex. 9 | Ex. 10 | Ex. 11 | Ex. 12 | Ex. 13 | Ex. 14 | Ex. 15 | Ex. 16 |
|---|---|---|---|---|---|---|---|---|---|---|---|
| | Other color materials | #4930 | Phthalocyanine compound | | | | | | | | |
| | | Elixa blue 648 | Anthraquinone compound | | | | | | | | |
| | | elixa red 348 | | | | | | | | | |
| | | elixa yellow 129 | | | | | | | | | |
| | | solbon black cr800 | Azine-type compound | | | | | | | | |
| | | bonjet black cw-1 | Carbon black | | | | | | | | |
| Evaluation | (1) Viscosity | | | D | D | D | D | D | D | D | D |
| | (2) Increase in viscosity | | | ○○ | ○○ | ○○ | ○○ | ○○ | ○○ | ○○ | ○○ |
| | (3) Inkjet ejection properties | | | ○○ | ○○ | ○○ | ○○ | ○○ | ○○ | ○○ | ○○ |
| | (4) Wet-spreadability | | | ○ | ○ | ○ | ○ | ○ | ○ | ○ | ○ |
| | (5) Length of pot life | | | ○○ | ○○ | ○○ | ○○ | ○○ | ○○ | ○○ | ○○ |
| | (6) Heat resistance | | | ○ | ○ | ○ | ○ | ○ | ○ | ○ | ○ |
| | (7) Solubility 2 of color material in curable composition | | | ○○ | ○○ | ○○ | ○○ | ○○ | ○○ | ○○ | ○○ |

TABLE 4

| | | Product Nos. | | Ex. 17 | Ex. 18 | Ex. 19 | Ex. 20 | Ex. 21 | Ex. 22 | Ex. 23 | Ex. 24 |
|---|---|---|---|---|---|---|---|---|---|---|---|
| Blend components (part by weight) | Component (C) | YD-127 | Bisphenol A-type epoxy resin | | | | 15 | 15 | 15 | 15 | 15 |
| | | YDF-170 | Bisphenol F-type epoxy resin | 20 | 20 | 35 | | | | | |
| | | EX-211 | Neopentyl glycol diglycidyl ether | | | | | | | | |
| | | JER630 | Glycidylamine-type epoxy resin | | | | | | | | |
| | | JER152 | Phenol novolac-type epoxy resin | | | | | | | | |
| | | TETRAD-X | Glycidylamine-type epoxy resin | | | | | | | | |
| | | TETRAD-C | Glycidylamine-type epoxy resin | | | | | | | | |
| | Component (A) | IRR214-K | Tricyclodecanedimethanol diacrylate | | | | 85 | 85 | | | |
| | | TMPTA | Trimethylolpropane triacrylate | 80 | 80 | 65 | | | 85 | | |
| | | 1,9-HDDA | 1,9-Hexanediol diacrylate | | | | | | | 85 | |
| | | 1,9-NDDA | 1,9-Nonanediol diacrylate | | | | | | | | 85 |
| | | NP-A | Neopentyl glycol diacrylate | | | | | | | | |
| | | 4EG-A | PEG200 diacrylate | | | | | | | | |
| | | 9EG-A | PEG400 diacrylate | | | | | | | | |
| | | 16EG-A | PEG600 diacrylate | | | | | | | | |
| | | MPD-A | 3-Methyl-1,5-pentanediol diacrylate | | | | | | | | |
| | Component (B) | IRGACURE 907 | α-Aminoalkylphenone-type photo-radical polymerization initiator | 5 | 5 | | | | 5 | 5 | 5 |
| | | IRGACURE 369 | α-Aminoalkylphenone-type photo-radical polymerization initiator | | | 5 | | | | | |
| | | IRGACURE 379EG | α-Aminoalkylphenone-type photo-radical polymerization initiator | | | | 5 | | | | |
| | | TPO | Acylphosphine oxide-type photo-radical polymerization initiator | | | | | 5 | | | |
| | Component (D) | Viscous reaction product produced in Synthetic example 1 | | 15 | | 15 | 15 | 15 | 15 | 15 | 15 |
| | | Viscous reaction product produced in Synthetic example 2 | | | 10 | | | | | | |
| | Component (E) | 650M | Phthalocyanine compound | 1 | 1 | 1 | 1 | 1 | 1 | 1 | 1 |
| | | valifast 2610 | Phthalocyanine compound | | | | | | | | |
| | | Valifast 2620 | Phthalocyanine compound | | | | | | | | |
| | | NUBIAN BLUE PS-5630 | Anthraquinone compound | | | | | | | | |
| | | elixa black 803 | | | | | | | | | |
| | | elixa black 840 | | | | | | | | | |
| | | elixa black 846 | | | | | | | | | |
| | | elixa green 502 | | | | | | | | | |
| | | elixa green 540 | | | | | | | | | |
| | | valifast blue 1605 | Phthalocyanine compound | | | | | | | | |
| | | valifast blue 2670 | Phthalocyanine compound | | | | | | | | |
| | | valifast black 3804 | Azo compound | | | | | | | | |
| | | valifast black 3820 | Azo compound | | | | | | | | |
| | | valifast black 3870 | Azo compound | | | | | | | | |
| | | valifast green 1501 | | | | | | | | | |
| | Other color materials | #4930 | Phthalocyanine compound | | | | | | | | |
| | | Elixa blue 648 | Anthraquinone compound | | | | | | | | |
| | | elixa red 348 | | | | | | | | | |
| | | elixa yellow 129 | | | | | | | | | |
| | | solbon black cr800 | Azine-type compound | | | | | | | | |
| | | bonjet black cw-1 | Carbon black | | | | | | | | |

TABLE 4-continued

| | Product Nos. | Ex. 17 | Ex. 18 | Ex. 19 | Ex. 20 | Ex. 21 | Ex. 22 | Ex. 23 | Ex. 24 |
|---|---|---|---|---|---|---|---|---|---|
| Evaluation | (1) Viscosity | D | D | D | D | D | D | D | D |
| | (2) Increase in viscosity | ○○ | ○○ | ○○ | ○○ | ○○ | ○○ | ○○ | ○○ |
| | (3) Inkjet ejection properties | ○○ | ○○ | ○○ | ○○ | ○○ | ○○ | ○○ | ○○ |
| | (4) Wet-spreadability | ○ | ○ | ○○ | ○ | ○ | ○ | ○ | ○ |
| | (5) Length of pot life | ○○ | ○○ | ○○ | ○○ | ○○ | ○○ | ○○ | ○○ |
| | (6) Heat resistance | ○ | ○ | ○ | ○ | ○ | ○ | ○ | ○ |
| | (7) Solubility 2 of color material in curable composition | ○○ | ○○ | ○○ | ○○ | ○○ | ○○ | ○○ | ○○ |

TABLE 5

| | | Product Nos. | | Ex. 25 | Ex. 26 | Ex. 27 | Ex. 28 | Ex. 29 | Ex. 30 | Ex. 31 | Ex. 32 |
|---|---|---|---|---|---|---|---|---|---|---|---|
| Blend components (part by weight) | Component (C) | YD-127 | Bisphenol A-type epoxy resin | 15 | 15 | 15 | 15 | 15 | | | |
| | | YDF-170 | Bisphenol F-type epoxy resin | | | | | | | | |
| | | EX-211 | Neopentyl glycol diglycidyl ether | | | | | | 15 | | |
| | | JER630 | Glycidylamine-type epoxy resin | | | | | | | 15 | |
| | | JER152 | Phenol novolac-type epoxy resin | | | | | | | | 15 |
| | | TETRAD-X | Glycidylamine-type epoxy resin | | | | | | | | |
| | | TETRAD-C | Glycidylamine-type epoxy resin | | | | | | | | |
| | Component (A) | IRR214-K | Tricyclodecanedimethanol diacrylate | | | | | | 85 | 85 | 85 |
| | | TMPTA | Trimethylolpropane triacrylate | | | | | | | | |
| | | 1,9-HDDA | 1,9-Hexanediol diacrylate | | | | | | | | |
| | | 1,9-NDDA | 1,9-Nonanediol diacrylate | | | | | | | | |
| | | NP-A | Neopentyl glycol diacrylate | 85 | | | | | | | |
| | | 4EG-A | PEG200 diacrylate | | 85 | | | | | | |
| | | 9EG-A | PEG400 diacrylate | | | 85 | | | | | |
| | | 16EG-A | PEG600 diacrylate | | | | 85 | | | | |
| | | MPD-A | 3-Methyl-1,5-pentanediol diacrylate | | | | | 85 | | | |
| | Component (B) | IRGACURE 907 | α-Aminoalkylphenone-type photo-radical polymerization initiator | 5 | 5 | 5 | 5 | 5 | 5 | 5 | 5 |
| | | IRGACURE 369 | α-Aminoalkylphenone-type photo-radical polymerization initiator | | | | | | | | |
| | | IRGACURE 379EG | α-Aminoalkylphenone-type photo-radical polymerization initiator | | | | | | | | |
| | | TPO | Acylphosphine oxide-type photo-radical polymerization initiator | | | | | | | | |
| | Component (D) | Viscous reaction product produced in Synthetic example 1 | | 15 | 15 | 15 | 15 | 15 | 10 | 10 | 10 |
| | | Viscous reaction product produced in Synthetic example 2 | | | | | | | | | |
| | Component (E) | 650M | Phthalocyanine compound | 1 | 1 | 1 | 1 | 1 | 1 | 1 | 1 |
| | | valifast 2610 | Phthalocyanine compound | | | | | | | | |
| | | Valifast 2620 | Phthalocyanine compound | | | | | | | | |
| | | NUBIAN BLUE PS-5630 | Anthraquinone compound | | | | | | | | |
| | | elixa black 803 | | | | | | | | | |
| | | elixa black 840 | | | | | | | | | |
| | | elixa black 846 | | | | | | | | | |
| | | elixa green 502 | | | | | | | | | |
| | | elixa green 540 | | | | | | | | | |
| | | valifast blue 1605 | Phthalocyanine compound | | | | | | | | |
| | | valifast blue 2670 | Phthalocyanine compound | | | | | | | | |
| | | valifast black 3804 | Azo compound | | | | | | | | |
| | | valifast black 3820 | Azo compound | | | | | | | | |
| | | valifast black 3870 | Azo compound | | | | | | | | |
| | | valifast green 1501 | | | | | | | | | |
| | Other color materials | #4930 | Phthalocyanine compound | | | | | | | | |
| | | Elixa blue 648 | Anthraquinone compound | | | | | | | | |
| | | elixa red 348 | | | | | | | | | |
| | | elixa yellow 129 | | | | | | | | | |
| | | solbon black cr800 | Azine-type compound | | | | | | | | |
| | | bonjet black cw-1 | Carbon black | | | | | | | | |
| Evaluation | (1) Viscosity | | | D | D | D | D | D | D | D | D |
| | (2) Increase in viscosity | | | ○○ | ○○ | ○○ | ○○ | ○○ | ○○ | ○○ | ○○ |
| | (3) Inkjet ejection properties | | | ○○ | ○○ | ○○ | ○○ | ○○ | ○○ | ○○ | ○○ |
| | (4) Wet-spreadability | | | ○ | ○ | ○ | ○ | ○ | ○ | ○ | ○ |
| | (5) Length of pot life | | | ○○ | ○○ | ○○ | ○○ | ○○ | ○○ | ○○ | ○○ |
| | (6) Heat resistance | | | ○ | ○ | ○ | ○ | ○ | ○ | ○ | ○ |
| | (7) Solubility 2 of color material in curable composition | | | ○○ | ○○ | ○○ | ○○ | ○○ | ○○ | ○○ | ○○ |

TABLE 6

| | | Product Nos. | | Ex. 33 | Ex. 34 | Comp. Ex 1 | Comp . Ex 2 | Comp. Ex 3 | Comp. Ex 4 | Comp. Ex 5 | Comp. Ex. 6 |
|---|---|---|---|---|---|---|---|---|---|---|---|
| Blend components (part by weight) | Component (C) | YD-127 | Bisphenol A-type epoxy resin | | | 15 | 15 | 15 | 15 | 15 | 15 |
| | | YDF-170 | Bisphenol F-type epoxy resin | | | | | | | | |
| | | EX-211 | Neopentyl glycol diglycidyl ether | | | | | | | | |
| | | JER630 | Glycidylamine-type epoxy resin | | | | | | | | |
| | | JER152 | Phenol novolac-type epoxy resin | | | | | | | | |
| | | TETRAD-X | Glycidylamine-type epoxy resin | 15 | | | | | | | |
| | | TETRAD-G | Glycidylamine-type epoxy resin | | 15 | | | | | | |
| | Component (A) | IRR214-K | Tricyclodecanedimethanol diacrylate | 85 | 85 | 85 | 85 | 85 | 85 | 85 | 85 |
| | | TMPTA | Trimethylolpropane triacrylate | | | | | | | | |
| | | 1,9-HDDA | 1,9-Hexanediol diacrylate | | | | | | | | |
| | | 1,9-NDDA | 1,9-Nonanediol diacrylate | | | | | | | | |
| | | NP-A | Neopentyl glycol diacrylate | | | | | | | | |
| | | 4EG-A | PEG200 diacrylate | | | | | | | | |
| | | 9EG-A | PEG400 diacrylate | | | | | | | | |
| | | 16EG-A | PEG600 diacrylate | | | | | | | | |
| | | MPD-A | 3-Methyl-1,5-pentanediol diacrylate | | | | | | | | |
| | Component (B) | IRGACURE 907 | α-Aminoalkylphenone-type photo-radical polymerization initiator | 5 | 5 | 5 | 5 | 5 | 5 | 5 | 5 |
| | | 1RGACURE 369 | α-Aminoalkylphenone-type photo-radical polymerization initiator | | | | | | | | |
| | | IRGACURE 379EG | α-Aminoalkylphenone-type photo-radical polymerization initiator | | | | | | | | |
| | | TPO | Acylphosphine oxide-type photo-radical polymerization initiator | | | | | | | | |
| | Component (D) | Viscous reaction product produced in Synthetic example 1 | | 10 | 10 | 10 | 10 | 10 | 10 | 10 | 10 |
| | | Viscous reaction product produced in Synthetic example 2 | | | | | | | | | |
| | Component (E) | 650M | Phthalocyanine compound | 1 | 1 | | | | | | |
| | | valifast 2610 | Phthalocyanine compound | | | | | | | | |
| | | Valifast 2620 | Phthalocyanine compound | | | | | | | | |
| | | NUBIAN BLUE PS-5630 | Anthraquinone compound | | | | | | | | |
| | | elixa black 803 | | | | | | | | | |
| | | elixa black 840 | | | | | | | | | |
| | | elixa black 846 | | | | | | | | | |
| | | elixa green 502 | | | | | | | | | |
| | | elixa green 540 | | | | | | | | | |
| | | valifast blue 1605 | Phthalocyanine compound | | | | | | | | |
| | | valifast blue 2670 | Phthalocyanine compound | | | | | | | | |
| | | valifast black 3804 | Azo compound | | | | | | | | |
| | | valifast black 3820 | Azo compound | | | | | | | | |
| | | valifast black 3870 | Azo compound | | | | | | | | |
| | | valifast green 1501 | | | | | | | | | |
| | Other color materials | #4930 | Phthalocyanine compound | | | 1 | | | | | |
| | | Elixa blue 648 | Anthraquinone compound | | | | 1 | | | | |
| | | elixa red 348 | | | | | | 1 | | | |
| | | elixa yellow 129 | | | | | | | 1 | | |
| | | solbon black cr800 | Azine-type compound | | | | | | | 1 | |
| | | bonjet black cw-1 | Carbon black | | | | | | | | 1 |
| Evaluation | (1) Viscosity | | | D | D | D | D | D | D | D | D |
| | (2) Increase in viscosity | | | ○○ | ○○ | X | X | X | X | X | X |
| | (3) Inkjet ejection properties | | | ○○ | ○○ | X | Δ | Δ | X | X | X |
| | (4) Wet-spreadability | | | ○ | ○ | ○ | ○ | ○ | ○ | ○ | ○ |
| | (5) Length of pot life | | | ○○ | ○○ | X | Δ | X | X | X | X |
| | (6) Heat resistance | | | ○ | ○ | ○ | ○ | ○ | ○ | ○ | ○ |
| | (7) Solubility 2 of color material in curable composition | | | ○○ | ○○ | X | ○○ | X | X | X | X |

In Tables 2 to 6 shown above, with respect to components (C), "YD-127" and "YDF-170" are products of Nippon Steel & Sumikin Chemical Co., Ltd., "EX-211" is a product of Nagase chemteX Corporation, "JER630" and "JER152" are products of Mitsubishi Chemical Corporation, and "TETRAD-X" and "TETRAD-C" are products of Mitsubishi Gas Chemical Company, Inc. With respect to components (A), "IRR-214-K" and "TMPTA" are products of Daicel-Allnex Ltd., and "1,9-HDDA", "1,9-NDDA", "NP-A", "4EG-A", "9EG-A", "16EG-A" and "MPD-A" are products of Kyoeisha Chemical Co., Ltd. With respect to components (B), "IRGACURE 907", "IRGACURE 369", "IRGACURE 379EG" and "TPO" are products of BASF Japan Ltd.

The invention claimed is:

1. A curable composition for inkjet which can be applied in an inkjet mode and can be cured by the irradiation with light and the application of heat, the curable composition comprising:

a polyfunctional compound having at least two (meth) acryloyl groups;

a photopolymerization initiator;

a compound having a cyclic ether group;

a heat-curing agent; and a color material, wherein the color material is a color material which satisfies a) as below:

a) when 100 g of a mixture produced by mixing the polyfunctional compound with the color material at 25° C. at a weight ratio of 90:10 is filtered through a mesh filter having a diameter of 1 cm and a mesh size of 1 μm at 100 hPa, the whole volume of 100 g of the mixture is not filtered within 5 minutes and, the curable composition satisfies b) as below:

b) when 100 g of the curable composition is filtered through a mesh filter having a diameter of 1 cm and a mesh size of 1 μm at 100 hPa, the whole volume of 100 g of the curable composition is filtered within 5 minutes.

2. The curable composition for inkjet according to claim 1, wherein the heat-curing agent is a viscous reaction product produced by reacting dicyandiamide or a hydrazide compound with a functional-group-containing compound having a functional group capable of reacting with dicyandiamide or the hydrazide compound.

3. The curable composition for inkjet according to claim 2, wherein a viscosity of the curable composition which is not heated is 160 mPa·s or more and 1200 mPa·s or less at 25° C., and a ratio of a viscosity of the curable composition which is heated at 80° C. for 24 hours under an oxygen-free condition to the viscosity of the curable composition which is not heated is 1.1 or less, wherein the viscosities are measured in accordance with JIS K2283.

4. The curable composition for inkjet according to claim 2, wherein the color material is a color material which satisfies c) as below:

c) when 100 g of a mixture produced by mixing the compound having a cyclic ether group with the color material at 25° C. at a weight ratio of 90:10 is filtered through a mesh filter having a diameter of 1 cm and a mesh size of 1 μm at 100 hPa, the whole volume of 100 g of the mixture is filtered within 5 minutes.

5. The curable composition for inkjet according to claim 2, wherein a viscosity of the curable composition which is not heated is 160 mPa·s or more and 1200 mPa·s or less at 25° C., and a ratio of a viscosity of the curable composition which is heated at 80° C. for 24 hours under an oxygen-free condition to the viscosity of the curable composition which is not heated is 1.1 or less, wherein the viscosities are measured in accordance with JIS K2283, and the color material is a color material which satisfies c) as below:

c) when 100 g of a mixture produced by mixing the compound having a cyclic ether group with the color material at 25° C. at a weight ratio of 90:10 is filtered through a mesh filter having a diameter of 1 cm and a mesh size of 1 μm at 100 hPa, the whole volume of 100 g of the mixture is filtered within 5 minutes.

6. The curable composition for inkjet according to claim 1, wherein a viscosity of the curable composition which is not heated is 160 mPa·s or more and 1200 mPa·s or less at 25° C., and a ratio of a viscosity of the curable composition which is heated at 80° C. for 24 hours under an oxygen-free condition to the viscosity of the curable composition which is not heated is 1.1 or less, wherein the viscosities are measured in accordance with JIS K2283.

7. The curable composition for inkjet according to claim 1, wherein the color material is a color material which satisfies c) as below:

c) when 100 g of a mixture produced by mixing the compound having a cyclic ether group with the color material at 25° C. at a weight ratio of 90:10 is filtered through a mesh filter having a diameter of 1 cm and a mesh size of 1 μm at 100 hPa, the whole volume of 100 g of the mixture is filtered within 5 minutes.

8. The curable composition for inkjet according to claim 1, wherein a viscosity of the curable composition which is not heated is 160 mPa·s or more and 1200 mPa·s or less at 25° C., and a ratio of a viscosity of the curable composition which is heated at 80° C. for 24 hours under an oxygen-free condition to the viscosity of the curable composition which is not heated is 1.1 or less, wherein the viscosities are measured in accordance with JIS K2283, and the color material can be dissolved in the compound having a cyclic ether group.

9. The curable composition for inkjet according to claim 1, wherein the color material comprises iron phthalocyanine.

10. The curable composition for inkjet according to claim 1, wherein the color material comprises a dihydroxyanthraquinone.

11. The curable composition for inkjet according to claim 1, wherein the color material comprises at least one of p-(phenylazo)phenol and 1,5-dioxynaphthalene.

12. A method for manufacturing an electronic part, comprising the steps of:

applying a curable composition for inkjet as recited in claim 1 in an inkjet mode to draw a pattern; and irradiating the pattern of the curable composition for inkjet with light and then applying heat to the pattern to cure the pattern, thereby forming a cured product layer.

13. A method for manufacturing an electronic part, comprising the steps of:

applying a curable composition for inkjet as recited in claim 2 in an inkjet mode to draw a pattern; and irradiating the pattern of the curable composition for inkjet with light and then applying heat to the pattern to cure the pattern, thereby forming a cured product layer.

14. A method for manufacturing an electronic part, comprising the steps of:

applying a curable composition for inkjet as recited in claim 6 in an inkjet mode to draw a pattern; and irradiating the pattern of the curable composition for inkjet with light and then applying heat to the pattern to cure the pattern, thereby forming a cured product layer.

15. A method for manufacturing an electronic part, comprising the steps of:

applying a curable composition for inkjet as recited in claim 7 in an inkjet mode to draw a pattern; and irradiating the pattern of the curable composition for inkjet with light and then applying heat to the pattern to cure the pattern, thereby forming a cured product layer.

16. A method for manufacturing an electronic part, comprising the steps of:

applying a curable composition for inkjet as recited in claim 8 in an inkjet mode to draw a pattern; and irradiating the pattern of the curable composition for inkjet with light and then applying heat to the pattern to cure the pattern, thereby forming a cured product layer.

17. A method for manufacturing an electronic part, comprising the steps of:

applying a curable composition for inkjet as recited in claim 3 in an inkjet mode to draw a pattern; and irradiating the pattern of the curable composition for inkjet with light and then applying heat to the pattern to cure the pattern, thereby forming a cured product layer.

18. A method for manufacturing an electronic part, comprising the steps of:

applying a curable composition for inkjet as recited in claim 4 in an inkjet mode to draw a pattern; and irradiating the pattern of the curable composition for inkjet with light and then applying heat to the pattern to cure the pattern, thereby forming a cured product layer.

19. A method for manufacturing an electronic part, comprising the steps of:

applying a curable composition for inkjet as recited in claim 5 in an inkjet mode to draw a pattern; and irradiating the pattern of the curable composition for inkjet with light and then applying heat to the pattern to cure the pattern, thereby forming a cured product layer.

* * * * *